United States Patent [19]

Pollack et al.

[11] Patent Number: 4,580,330
[45] Date of Patent: Apr. 8, 1986

[54] INTEGRATED CIRCUIT ISOLATION

[75] Inventors: Gordon P. Pollack, Richardson; Clarence W. Teng, Plano; William R. Hunter, Garland; Christopher Slawinski, Dallas; Robert R. Doering, Plano, all of Tex.

[73] Assignee: Texas Instruments Incorporated, Dallas, Tex.

[21] Appl. No.: 621,019

[22] Filed: Jun. 15, 1984

[51] Int. Cl.$^4$ ............................................. H01L 21/76
[52] U.S. Cl. ................................. 29/576 W; 29/578; 29/580; 148/DIG. 50; 357/50
[58] Field of Search ................ 29/576 W, 578, 580; 148/1.5, DIG. 50; 357/50, 52, 53, 54

[56] References Cited

U.S. PATENT DOCUMENTS 4,462,846  7/1984  Varshney ..................... 29/576 W

OTHER PUBLICATIONS

Chiu, K. Y. et al., "The Sloped-Wall SWAMI... Technology" in *IEEE Transactions on Electron Devices*, vol. Ed-30, No. 11, Nov.-1983, pp. 1506-1511.

Primary Examiner—Brian E. Hearn
Assistant Examiner—Alan E. Schiavelli
Attorney, Agent, or Firm—Robert Groover; Melvin Sharp; Richard Donaldson

[57] ABSTRACT

An integrated circuit isolation technology wherein the nitride-sidewall methods of the prior art are improved by performing an undercut and backfill before the second nitride (the sidewall nitride which prevents encroachment) is added to the first nitride (which covers the moat areas). Thus, the butt joint between the two nitrides is made more secure, and localized bird's-beaking at the butt joint between the moat nitride and the sidewall nitride does not occur.

9 Claims, 16 Drawing Figures

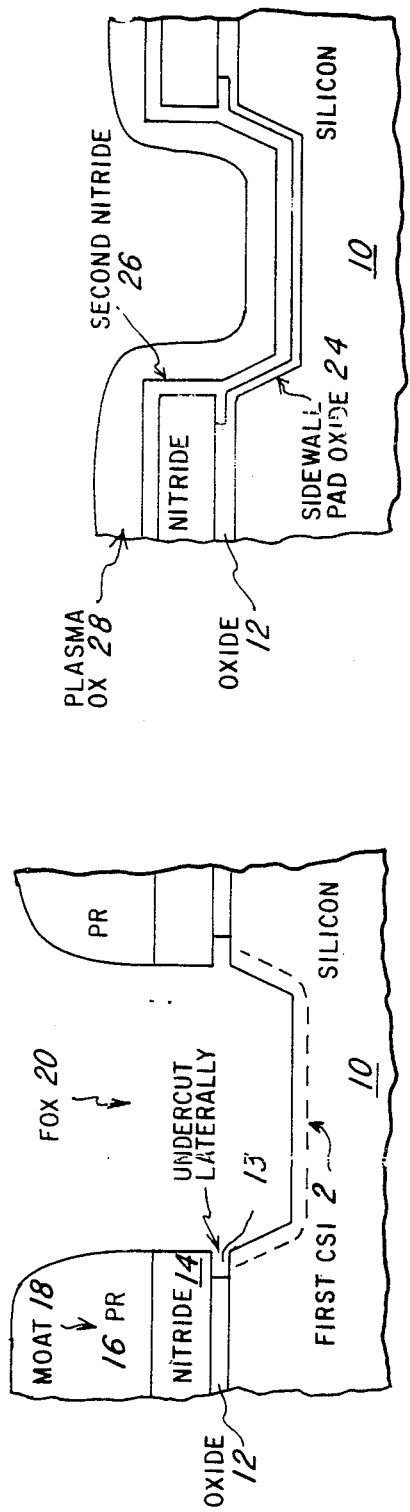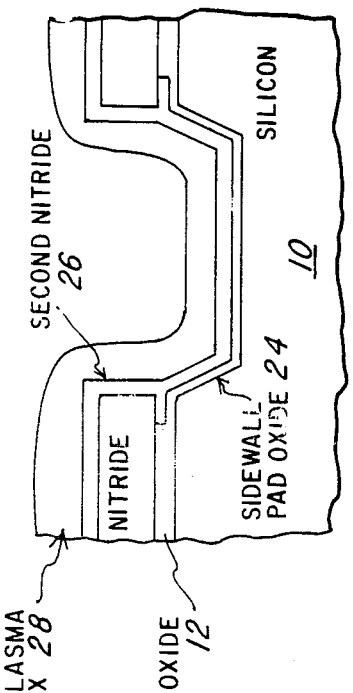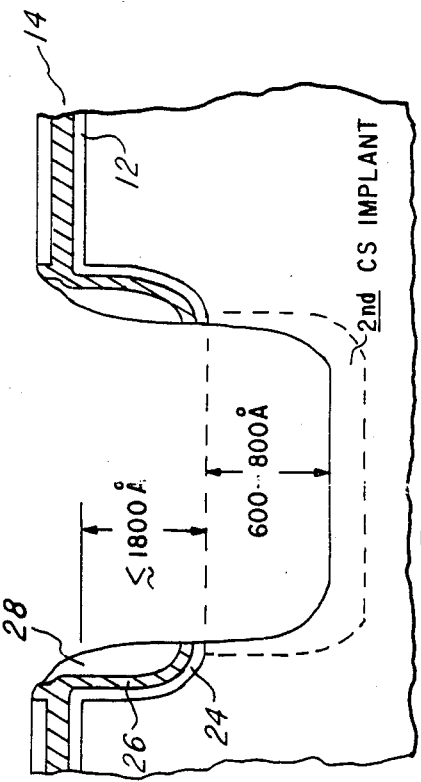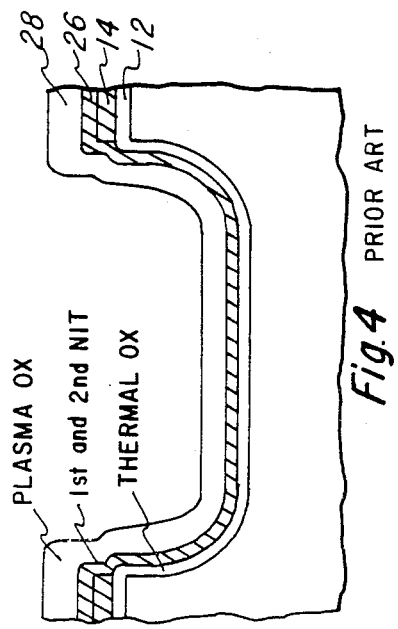

INTEGRATED CIRCUIT ISOLATION

BACKGROUND AND SUMMARY OF THE INVENTION

The present invention relates to integrated circuit isolation technology.

In integrated circuit technology, it is always necessary to separate the active regions of active devices (the "moat regions") one from another. In LSI and VLSI integrated circuits using MOS technology, this is usually performed by LOCOS (an acronym for "local oxidation of silicon"). In LOCOS, a patterned nitride is used to cover the areas which will be the moat regions, and the field oxide is then grown, by exposure to a high-temperature oxidizing ambient, in the exposed regions. However, it has long been recognized as a problem with this technology that the field oxide will not only grow vertically in the exposed regions, but will also grow laterally underneath the edges of the nitride mask. The lateral oxide encroachment (known as "bird's-beak") under the nitride is about half the field-oxide thickness, and this means that substantial real estate is wasted in this isolation technology.

A newer isolation technology, which is generally known by the acronyms SWAMI (Sidewall Masked Isolation) or MF³R (Modified Fully Framed Fully Recessed), uses a silicon etch and sidewall nitride layer to suppress the lateral encroachment of the field oxide. That is, after the patterned first nitride layer defines the active device regions, a silicon etch is then performed where the field oxide regions will be, and a sidewall nitride is deposited (over a pad oxide) on the sidewalls of this etched recess, to avoid encroachment of the field oxide into the active device regions. This general approach has the advantage of being easily integrated in standard MOS process flows, requires no additional photomasking steps, and can reduce moat encroachment to nearly zero.

However, this process has not generally been adopted in production use, since it still has several major shortcomings. In particular, the joint between the first nitride and second nitride, i.e. between the nitride which defines the moat regions and the nitride which covers the sidewalls of the moat regions, will sometimes fail, leading to a localized bird's-beak. This degrades reliability unacceptably for a production process.

Thus it is an object of the present invention to provide a high-yield isolation method which does not provide large moat encroachment.

It is a further object of the present invention to provide an isolation technology which does not generate substantial moat encroachment, and which does not degrade yield through risk of substantial bird's-beaking.

It is a further object of the present invention to provide a sidewall-nitride silicon-oxidation isolation technology which is highly reliable.

It is a further object of the present invention to provide a sidewall-nitride silicon-oxidation isolation technology which does not degrade yield through risk of localized bird's-beaking.

The present invention provides these and other objects advantageously, by providing a process wherein the stress-relief oxide underneath the first nitride is undercut by an isotropic oxide etch before the second nitride is deposited, so that conformal deposition of the second nitride fills in this undercut underneath the first nitride. Thus, the nitride-nitride joint is reliably tight with increased overlay area, avoiding localized bird's-beaking.

A further embodiment of the present invention performs the original moat patterning not on a nitride/oxide stack, as is conventional, but on oxide/nitride/oxide stack. Thus, then the second nitride is conformally deposited, the stack over the moat regions is an oxide/nitride/oxide/nitride stack. When the second nitride is removed, the full thickness of the first nitride remains in place over the moat regions. Preferably the second oxide is striped before field oxidation, so that there is no uncertainty as to the actual remaining thickness of the hardmask over the moat layers at the time of the channel stop implant. A further advantage of this additional oxide layer is that a heavier dose and energy can be used for the channel stop, without significant penetration through the hard mask.

To achieve these and other objects and advantages, the present invention provides:

A method for fabrication of integrated circuits, comprising the steps of:

providing a monocrystalline silicon substrate;

covering predetermined postions of said substrate with a first patterned composite layer, comprising a first pad layer and a first silicon nitride layer over said first pad layer;

anisotropically etching a recess in said substrate where not covered by said first patterned composite layer;

etching said pad layer to form a cavity under portions of the periphery of said first nitride layer;

conformally depositing a sidewall masking layer to cover sidewalls of said recess and substantially fill said cavity;

anisotropically etching said sidewall masking layer to substantially clear the bottom of said recess;

oxidizing exposed portions of silicon to form isolation oxide in said recess;

removing said first composite layer; and forming desired active devices in portions of said substrate formerly covered by said first composite layer.

BRIEF DESCRIPTION OF THE DRAWINGS

The present invention will be described with reference to the accompanying drawings, wherein:

FIG. 1 shows a first embodiment of the invention, wherein a first nitride, with a first stress relief oxide underneath it, has been patterned and exposed portions of silicon have been etched. The first stress relief oxide has been undercut to assist the joint between the first and second nitrides.

FIG. 2 shows a further stage in processing of the structure of FIG. 1, wherein the second nitride (together with a sidewall pad oxide underneath for stress relief) has been conformally deposited.

FIG. 3 shows fabrication of a further embodiment of the invention, wherein a two step silicon etch is performed, preferably combined with a two or three step channel stop implant.

FIGS. 4 and 5 show a prior art process, wherein the first nitride is thinned during the etch step which clears the second nitride off the bottom of the silicon recess.

DESCRIPTION OF THE PREFERRED EMBODIMENTS

Figure 5:
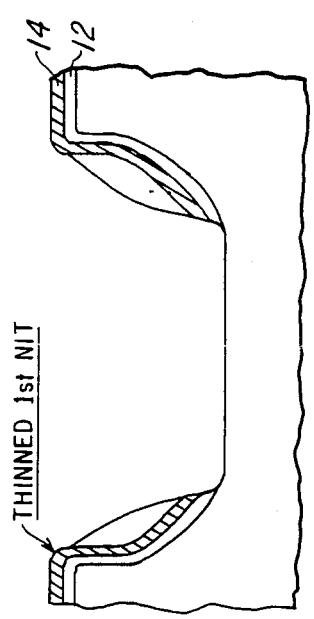

In a first embodiment of the present invention, sidewall-nitride isolation methods are improved by using an undercut and backfill technique to make a better joint between the first and second nitride layers. That is, as seen in FIG. 1, on a silicon substrate 10 a pad oxide 12 is grown, and a silicon nitride layer 14 is deposited. The thickness of the pad oxide layer 12 will typically be in the range of 100 to 500 Angstroms and typically 350 Angstroms, and this is preferably a grown oxide. The thickness of the first nitride layer 14 is typically in the range of 500 to 3000 Angstroms preferably 1100 Angstroms, and this nitride layer is preferably deposited by low pressure chemical vapor deposition. The photoresist pattern 16 is used to define where the moat regions 18 will be, and to expose regions 20 where the field oxide will be. After the resist 16 has been deposited and patterned, the nitride 14 and oxide 12 are etched according to this pattern. The etching conditions preferably used are 30 SCCM of $CHF_3$, 60 SCCM of helium, and 30 SCCM of $C_2F_6$, at a pressure of about 1 Torr. This etch provides a conveniently slow etching rate, so that good operator control can be achieved.

The silicon can now be etched to a depth not less than 500 Angstroms to form recesses in regions 20. In the presently preferred embodiment, the silicon is etched to a depth of about 1200 Angstroms, but this depth can be widely varied as will be further discussed below. The recesses in regions 20 are preferably not etched with vertical sidewalls, since recesses with sloping sidewalls (having an angle between 40 degrees and 75 degrees) are less likely to generate stress induced defects in silicon during the field oxidation step. The presently preferred embodiment for the silicon etching chemistry uses Freon 11 at 110 SCCM, argon at 200 SCCM, and nitrogen at 200 SCCM, at a pressure of 25 milliTorr and a power of 500 Watts. However, a wide variety of other silicon etches could be used, as is well known to those skilled in the art.

When this etch has exposed the substrate 10 in regions 20 where the field oxide is to be formed, a further etching step is performed to undercut the oxide layer 12. In the presently preferred embodiment, this step is a wet etch, in a concentrated $HF/NH_4F$ solution for about 40 seconds at room temperature. This produces a cavity 13 in the oxide 12, around the periphery of nitride layer 14, which is about 400 Angstroms wide.

At this point, a second pad oxide, the sidewall pad oxide 24, is preferably grown (to, e.g., 250 A thick), and the second nitride layer 26 is then deposited by low pressure CVD to a thickness of between 100 and 1000 Angstroms, for example, 400 Angstroms. The second pad oxide 24 is preferably thinner than the first oxide 12, since the second pad oxide 24 must leave room for second nitride 26 inside cavity 13.

At this point, an additional oxide layer 28 is preferably deposited. Preferably this is a plasma oxide (i.e., an oxide layer deposited by plasma-enhanced deposition), of a presently preferred thickness of 2000 Angstroms. This oxide is optionally not densified. The following etch will clear this oxide from the bottom of the recess, and from atop the nitride layers over the moat region, but filaments of this oxide will be left on the sidewalls of the recess. The filaments of the plasma oxide 28 on the sloping sidewalls of the recess will protect the second nitride layer 26 from thinning, and also prevent the channel stop implant from providing too much concentration of the channel stop species too close to active device areas.

At this point, an anisotropic oxide/nitride/oxide etch is preferably performed. In the presently preferred embodiment, this etch uses 4 SCCM of oxygen, 50 SCCM of $CHF_3$, 100 SCCM of helium, and 10 SCCM of $C_2F_6$, at 1½ Torr. This etch will etch oxide and nitride at approximately the same rate, although of course low-density oxides (such as undensified plasma oxide) will be etched faster than high-density oxides. This etching step will leave only sidewall filaments (of plasma oxide 28 sidewall nitride 26 and pad oxide 24, will clear the bottom of the recess, and will also (unless the process is further modified) thin the nitride layer 14 somewhat.

Figure 6:
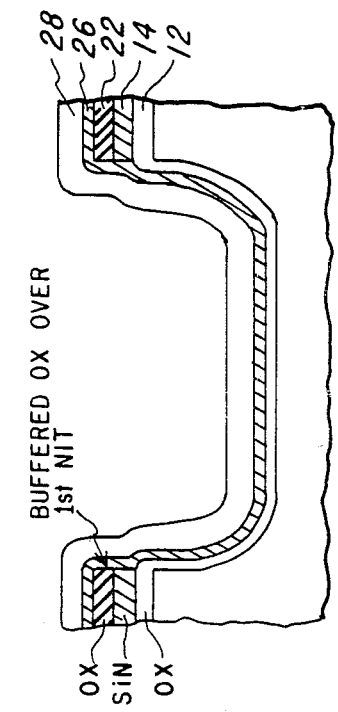
FIGS. 6 and 7 show a further embodiment of the invention, wherein an oxide is deposited on top of the first nitride, and is patterned with the first nitride, so that the etch which clears the second nitride can leave the first nitride entirely intact, permitting better process control over moat encroachment and a heavier energy and dosage on the channel stop implant.
Figure 7:
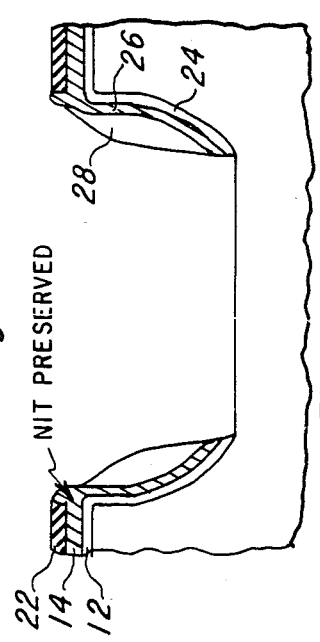
Figure 8:
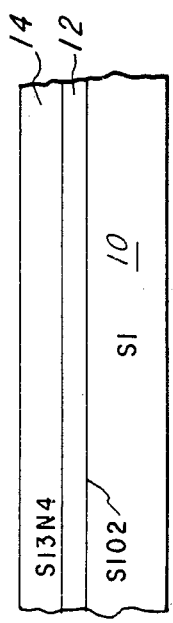
FIGS. 8 through 12 show a sample process flow in one embodiment of the present invention.
Figure 9:
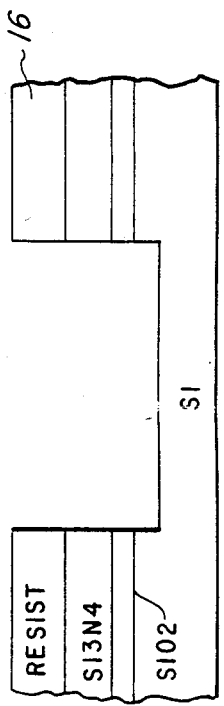
Figure 10:
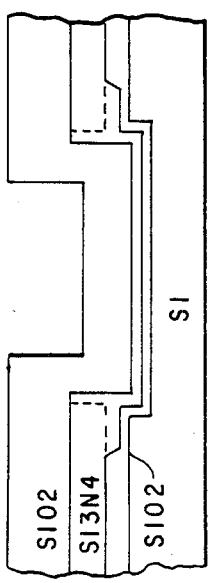
Figure 11:
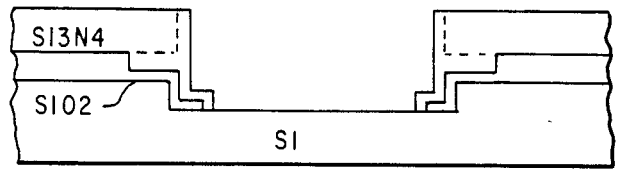
Figure 12:
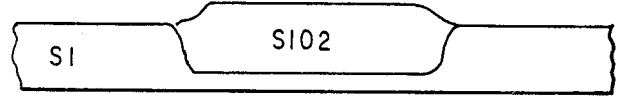
Figure 13:
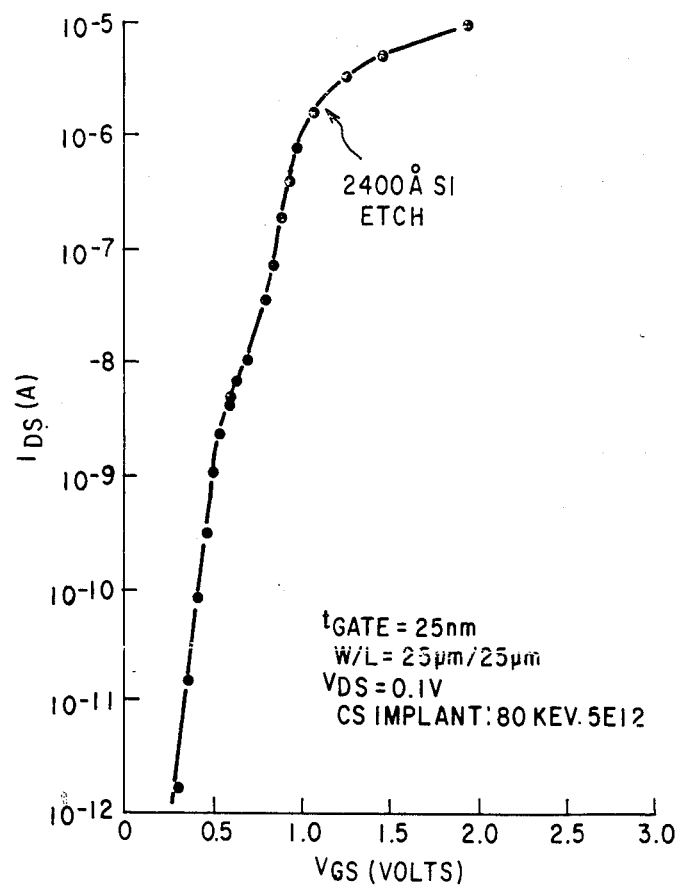
FIG. 13 shows the subthreshold characteristics of a device according to in the prior art, showing the so-called double threshold characteristic.
Figure 14:
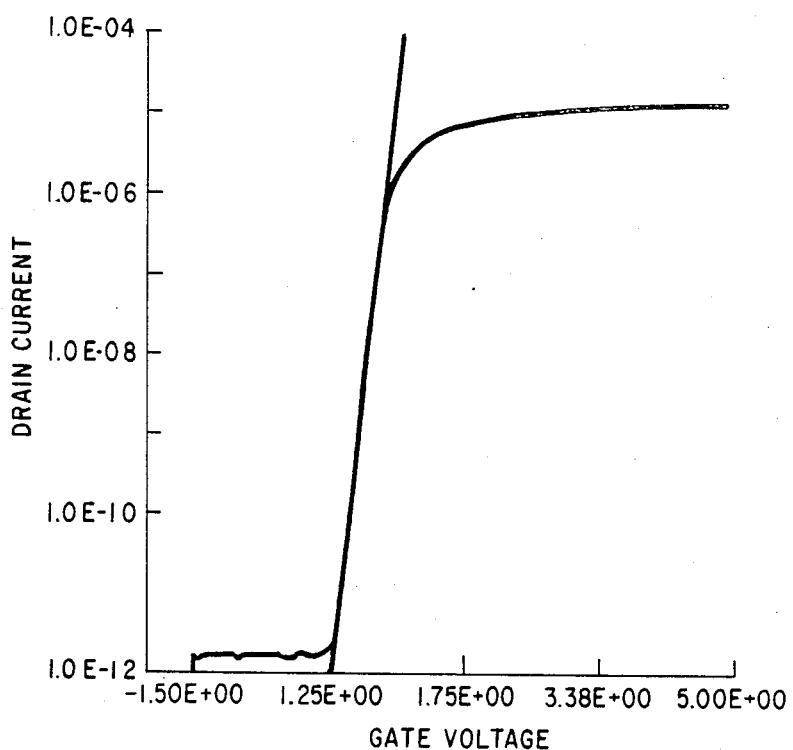
FIG. 14 shows the subthreshold characteristics of a device according to the present invention, wherein a double channel stop implant has been performed, showing that the double threshold voltage characteristic is eliminated.
Figure 15:
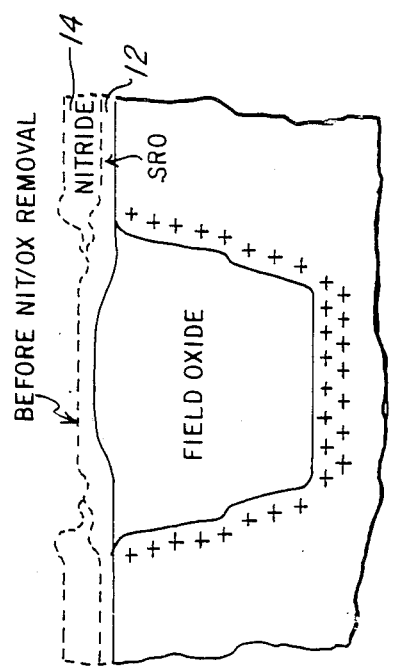
FIG. 15 shows a subsequent stage in the fabrication of a device according to FIG. 3, after the field oxide has been grown.

In a further embodiment of the invention, an additional buffer oxide layer 22 (e.g. a 1000 A layer of densified plasma oxide) is initially deposited atop pad oxide 12 and first nitride 14, so that the photoresist pattern 16 is used to pattern a 3 layer oxide/nitride/oxide stack rather than merely a 2 layer oxide/nitride stack. Thus, instead of the nitride layer 14 being thinned when the oxide 28, nitride 26 and oxide 24 are etched off of the bottom of the recess, the buffer oxide 22 will be thinned instead. This means that the full thickness of the first nitride layer 14 is left intact, so that this thickness is accurately known. This layer, being of controlled thickness, will provide a known and controlled degree of mechanical resistance to deformation, and this mechanical resistance affects the degree of encroachment during field oxidation. In a further alternative embodiment, a deglaze etch (e.g. a solution of $HF/NH_4$) etch may be performed before the field oxidation step, to remove the remnants of buffer oxide layer 22 from on top of the first nitride 14 (and oxide 28 from sidewall nitride 26), so that the thickness (and therefore stiffness) of first nitride 14 (and of sidewall nitride 26) are precisely known, so that the degree of residual oxide encroachment can be more precisely predicted. Thus, as seen in FIG. 6 and 7, the use of buffer oxide layer 22 permits the first nitride layer 14 to be preserved intact when the bottom of the recess has been cleared. By contrast, n the prior art, as seen in FIGS. 4 and 5, the first nitride layer 14 would have been thinned significantly at this point.

In a further embodiment, the etch used to clear the second nitride layer 26 from the bottom of the moat is selective to oxide. The $O_2/CH_3F/C_2F_6$ etch recipe specified above for the oxide nitride stack etch is not selective to oxide, but selectivity to oxide can be achieved merely by increasing the flow rate of oxygen in this recipe. That is, in this alternative embodiment, an etch is used which etches nitride faster than oxide, so that the second nitride layer 26 is reliably cleared from the bottom of the recess without removing too much thickness from buffer oxide layer 22.

In all of the nitride/oxide etching variation embodiments discussed above, other etch chemistries can also be substituted. However, in any case, the etch used should be reasonably selective to silicon.

The channel stop implant can now be performed. The channel stop species, dosage, and energy will naturally be selected with reference to the particular device type, substrate type, field oxide thickness, and operating voltage used. In a sample embodiment, for 5 volt operation with an 8500 A field oxide, the channel stop implant would be boron at, for example, an energy of 80 keV and a dosage of 5E12 per square centimeter.

Alternatively, a light first channel stop implant could be performed after the first nitride layer is patterned, and a second channel stop implant performed after the silicon recess etch has been performed.

In a further class of embodiments, as shown in FIG. 3, a two step silicon etch is performed. That is, the recess is formed as described above, and the sidewall pad oxide 24, second nitride 26 and plasma oxide 28 are cleared from the bottom, but not the sides, of the trench. However, at this point a second silion etch, preferably having high selectivity to oxide and nitride, is performed. In a sample embodiment, the first silicon etch is performed to a depth of 1800 Angstroms, and the second etch is performed to go an additional 600 to 800 Angstroms deeper. After this second silicon etch, a high dose channel stop implant (e.g. $2 \times 10^{13}$ per centimeter squared) can be performed, which provides additional thick parasitic threshold increase, and hence radiation hardness, as discussed above.

Alternatively, to avoid excess subthreshold current in the parasitic field oxide transistor, 2 channel stop implants are performed. A first channel stop implant is performed at the stage of fabrication shown in FIG. 1, after the silicon recess has been etched but before the second nitride 26 is deposited. This channel stop implant will diffuse into the silicon recess sidewalls somewhat, to prevent turn-on of the parasitic leakage paths at the channel edges. In this case, the first channel stop implant would preferably be a relatively light dose, for example 1E11 to 1E12 per square centimeter at 80 KEV, and the second channel stop implant would be a heavy dose implant as discussed.

In a further embodiment of the invention, three separate channel stop implants are performed. The first channel stop implant is performed after the oxide/nitride (or oxide/nitride/oxide) stack has been patterned. The second implant is performed after the first silicon etch. This second implant can be performed either before or after the sidewall oxide/nitride layers have been placed on the sidewalls of the recess. The third channel stop implant is performed after the second silicon etch has been performed as described above. This third channel stop implant is the main source of channel stop doping, and can be applied at moderate to very heavy dosages, e.g. 1E12 per square centimeter up to 1E14 per square centimeter. The second channel stop implant is preferably a lighter dose, and seves to prevent inversion of the recess sidewalls. The first channel stop implant is preferably even a lighter dose yet, and serves principally to avoid field-enhanced turn-on at the corners of the moat as discussed above.

A particular advantage of the two-step silicon etch embodiment is that the stress-limited maximum vertical length of the nitride can respected. That is, a major limitation of sidewall-nitride isolation technology has been leakage currents caused by defects induced during field oxidation by the mechanical stress caused by the mismatch between the sidewall nitride and the silicon substrate. To avoid this effect, the maximum vertical length of the sidewall nitride must be limited. The limit is not absolute, but is dependent on the thickness of the sidewall pad oxide 24. Where the pad oxide 24 is 150 Angstroms thick, and the sidewall nitride layer 26 is 400 Angstroms thick, the vertical nitride length must be less than about 1000 Angstroms. If the sidewall pad oxide 24 is made 350 Angstroms thick, the vertical nitride length can be increased to 2000 Angstroms. However, in any case, the vetical nitride length should be limited to the defect free limit. The key advantage of the double-silicon-etch embodiment discussed is that the vertical nitride length can be limited without limiting the degree of recess. That is, if the silicon recess is made only 1000 Angstroms deep, the isolation will not be fully recessed, i.e. an 8500 A grown field oxide will protrude substantially above the surface of the substrate 10, thus sacrificing one of the advantages of sidewall nitride. Moreover, such a shallow silicon recess means that a very high-dose channel stop must not be used to avoid contamination of active device regions by the channel-stop species.

Thus, this embodimet of the invention, as shown in FIG. 3, provides fully recessed isolation with a high-dose channel stop without stress induced defects. The field oxide can be grown to a final thickness of between 3000 and 13000 Angstroms or roughly triple the silicon etching depth, and a thick field oxide can be used without generating stress induced defects in the moat sidewalls.

An alternative baseline proces flow for the semi-recessed isolation case is illustrated in FIGS. 8-12. An initial 60nm thermal oxide layer is grown at 900° C. followed by 1200 Angstroms of LPCVD silicon nitride. Moat regions are then patterned, and the nitride/oxide layer is removed from the inverse moat regions using an anisotropic plasma etch. This is followed by a 60 nm vertical dry silicon etch. Next a conventional 5.0E12 ions/cm2, 90 Kev boron channel stop implant is performed in order to raise the thick field threshold voltage. The slices are then etched for 30-60 sec in an HF/Nh4F solution, to produce a cavity as discussed. The slices are then cleaned, and a 15 nm stress relief oxide layer is grown over the vertical silicon sidewall at 900 C. The sidewall nitride oxidation mask is then formed by depositing 40 nm of LPCVD silicon nitride, 200 nm of LPCVD silicon dioxide, and vertically etching the oxide/nitride stack to retain the sidewall. The purpose of the 200 nm LPCVD oxide layer is to prevent thinning of the sidewall nitride layer during etch. After the vertical etch, the LPCVD buffer oxide layer is removed by wet etching, which leaves the active device regions fully framed by the top and sidewall nitride layers. Local field oxidation is then carried out in the normal manner at 900 C. in steam for at least 20 minutes.

The present invention has been discussed with primary reference to silicon nitride, which is the generally preferred oxidation masking material in the semiconductor industry. However, other oxidation masking materials could be used if desired.

The foregoing embodiments of the invention have been discussed with primary reference to fabrication of MOS integrated circuits. However, the present invention is also applicable to fabrication of bipolar integrated circuits, as will now be discussed.

Figure 16:
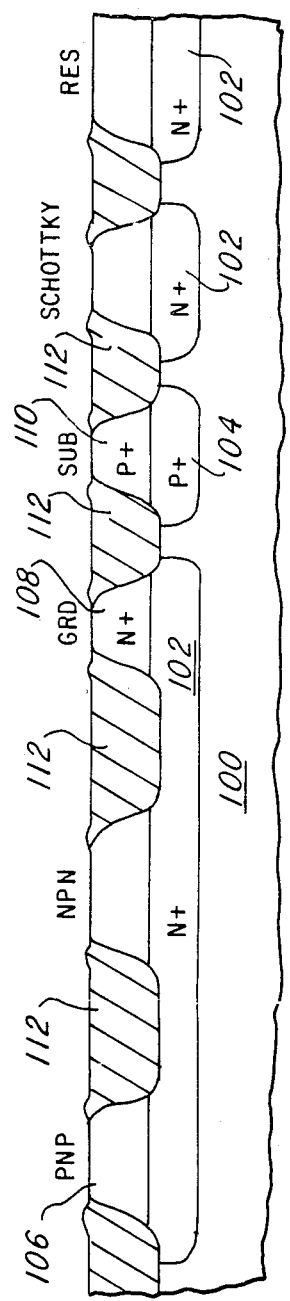
FIG. 16 shows a sample further embodiment of the invention in a bipolar fabrication process.

FIG. 16 shows a sample of a bipolar integrated circuit structure at an early stage of fabrication. A silicon substarate 100 is implanted to form n+ buried layers 102 and p+ varied layers 104 in a desired configuration. A lightly doped epitaxial layer 106 is then grown on top of substrate 100 and buried layers 102 and 104. N+ contact regions 108 and p+ contact regions 110 will typically then be formed, and oxide isolation regions 112 are then formed using the present invention. That is, a pad oxide e.g. of 350 Anstroms is grown, and a first nitride layer (e.g. 1000 Angstroms of LPCVD nitride) is deposited on top of it. This nitride/oxide stack is then patterned to expose the desired locations of oxide isolation regions 112. A particular requirement of the oxide isolation regions 112, which is not applicable to MOS field oxide formation, is that the oxide isolation regions 112 must reach all the way through the epitaxial layer 106. In addition, these oxide isolation regions are preferably fully planar, to facilitate the later steps in bipolar processing.

After the 1000 Angstrom nitride layer has been patterned, a silicon etch, selective to oxide and nitride, is used to etch out the recesses 112 to approximately ½ the thickness of the epitaxial layer 106.

The oxide regions 112 are then formed according to the present invention. That is, after the silicon recess etch, the first pad oxide is briefly wet etched, to undercut the first nitride slightly around its periphery, a thin second pad oxide is grown, a thin second nitride layer is conformally deposited, and a long oxidation step is then performed to grow the oxide 112.

The key advantage of the present invention in this embodiment is that lateral encroachment of the oxide regions 112 is extremely tightly controlled. This means that close lateral spacing can be used.

A further advantage of the present invention, in bipolar processing, is that, unlike in MOS processing, the oxides will frequently be grown in between two extremely heavily doped contact regions 108 and 110. Use of a sidewall nitride process assists in minimizing deleterious dopant migration effects during the oxide growth process.

In a further embodiment of the present invention, the initial patterning of the oxide regions 112 is performed using not merely an oxide/nitride stack, but an oxide/nitride/oxide stack. As discussed above, this means that the thickness of a nitride layer during the field oxidation step which forms oxide regions 112 is precisely known, and therefore further refinement of process control over the lateral encroachment of regions 112 is obtained.

Thus, the present invention provides as advantages all of the objects discussed above, as well as numerous other advantages. As will be apparent to those skilled in the art, the present invention can be widely modified and varied. The scope of the present invention is not limited except as set forth in the accompanying claims.

What is claimed is:

1. A method for fabrication of integrated circuits, comprising the steps of:
    providing a monocrystalline silicon substrate;
    covering predetermined portions of said substrate with a first patterned composite layer, comprising a first pad oxide layer and a first silicon nitride layer over said first pad oxide layer;
    anisotropically etching a recess in said substrate where not covered by said first patterned composite layer;
    etching said pad oxide layer to form a cavity under portions of the periphery of said first nitride layer;
    conformally depositing a sidewall masking layer to cover sidewalls of said recess and substantially fill said cavity;
    anisotropically etching said sidewall masking layer to substantially clear the bottom of said recess;
    oxidizing exposed portions of silicon to form isolation oxide in said recess;
    removing said first composite layer; and
    forming desired active devices in portions of said substrate formerly covered by said first composite layer.

2. The method of claim 1, further comprising the step of:
    performing a channel stop implant, after said substrate etching step and before said silicon oxidizing step.

3. The method of claim 1, wherein:
    said substrate etching step etches to a depth not less than 500 Angstroms.

4. The method of clam 1, wherein:
    said sidewall masking layer has a thickness in the range of 100 to 1000 Angstroms.

5. The method of claim 1, wherein:
    said oxidization step is performed to form an oxide layer having a thickness in the range between 3000 and 13000 Anstroms.

6. The method of claim 1, wherein:
    said substrate recess is etched to have a sidewall angle between 40 degrees and 75 degrees.

7. The method of claim 1, wherein:
    said first silicon nitride layer has a thickness in the range of 500 to 3000 Angstroms.

8. The method of claim 1, wherein:
    said oxidizing step is performed in an atmosphere comprising steam for at least 20 minutes at at least 900° C.

9. The method of claim 1, wherein said first pad oxide has a thickness in the range of 100 to 500 Angstroms.

* * * * *